(12) United States Patent  
Tevell et al.

(10) Patent No.: US 9,192,047 B2  
(45) Date of Patent: Nov. 17, 2015

(54) MOUNTING SYSTEM FOR TRANSMITTER RECEIVER MODULES OF AN ACTIVE ELECTRONICALLY SCANNED ARRAY

(75) Inventors: Martin Tevell, Göteborg (SE); Erik Lindälv, Landvetter (DE)

(73) Assignee: SAAB AB, Linköping (SE)

( * ) Notice: Subject to any disclaimer, the term of this patent is extended or adjusted under 35 U.S.C. 154(b) by 187 days.

(21) Appl. No.: 13/824,781

(22) PCT Filed: Oct. 1, 2010

(86) PCT No.: PCT/SE2010/051060  
§ 371 (c)(1),  
(2), (4) Date: Mar. 18, 2013

(87) PCT Pub. No.: WO2012/044219  
PCT Pub. Date: Apr. 5, 2012

(65) Prior Publication Data  
US 2013/0183913 A1 Jul. 18, 2013

(51) Int. Cl.  
*H05K 1/18* (2006.01)  
*H01Q 1/12* (2006.01)  
(Continued)

(52) U.S. Cl.  
CPC ............... *H05K 1/181* (2013.01); *H01Q 1/02* (2013.01); *H01Q 1/1207* (2013.01); *H01Q 1/526* (2013.01); *H01Q 21/0025* (2013.01); *H05K 1/0203* (2013.01); *H05K 1/0215* (2013.01);  
(Continued)

(58) Field of Classification Search  
IPC .......................................... H05K 1/181,1/0203  
See application file for complete search history.

(56) References Cited

U.S. PATENT DOCUMENTS

| | | | |
|---|---|---|---|
| 3,818,386 A | 6/1974 | Granberry | |
| 5,461,392 A | 10/1995 | Mott et al. | |

(Continued)

FOREIGN PATENT DOCUMENTS

| | | | |
|---|---|---|---|
| DE | 3625113 A1 | 2/1988 | |
| EP | 2159876 A1 | 3/2010 | |
| WO | WO-2010056160 A1 | 5/2010 | |

OTHER PUBLICATIONS

PCT/ISA/210—International Search Report—Jun. 7, 2011 (Issued in PCT/SE2010/051060).

(Continued)

*Primary Examiner* — Alejandro Rivero  
(74) *Attorney, Agent, or Firm* — Venable LLP; Eric J. Franklin

(57) ABSTRACT

A mounting system adapted to receive a plurality of transmitter receiver modules and each including an upper antenna part and a lower electronic components part. The lower part includes transmitter receiver module contacts on the end opposite the upper part. The mounting system includes a substrate rear panel including transmitter receiver module contact receivers on a first side and active support units on a second side. Each contact receiver is adapted to receive transmitter receiver module contacts of one receiver module. The supports are adapted to support a plurality of receiver modules. One single substrate rear panel is adapted to receive the receiver modules in a matrix. The mounting system includes a ground plane and an electric conductive sheet, and is arranged such that when the receiver modules are mounted in the mounting system, the ground plane levels with the receiver modules transition from the upper to the lower part.

14 Claims, 3 Drawing Sheets

(51) Int. Cl.
 H01Q 21/00 (2006.01)
 H05K 1/02 (2006.01)
 H01Q 1/02 (2006.01)
 H01Q 1/52 (2006.01)
 H05K 1/14 (2006.01)
 H05K 3/36 (2006.01)

(52) U.S. Cl.
 CPC ............... *H05K 1/141* (2013.01); *H05K 3/366* (2013.01); *H05K 2201/10098* (2013.01); *H05K 2201/10409* (2013.01); *H05K 2201/2027* (2013.01)

(56) References Cited

U.S. PATENT DOCUMENTS

| | | | |
|---|---|---|---|
| 6,469,671 B1 * | 10/2002 | Pluymers et al. | 343/702 |
| 7,348,932 B1 | 3/2008 | Puzella et al. | |
| 2003/0142026 A1 | 7/2003 | Hadden et al. | |
| 2004/0203528 A1 * | 10/2004 | Ammar et al. | 455/90.3 |
| 2005/0253770 A1 | 11/2005 | Edward et al. | |
| 2008/0291115 A1 * | 11/2008 | Doan et al. | 343/893 |
| 2010/0060517 A1 | 3/2010 | Nichols et al. | |
| 2010/0099370 A1 * | 4/2010 | Nichols et al. | 455/129 |
| 2012/0105290 A1 * | 5/2012 | Brown et al. | 343/720 |

OTHER PUBLICATIONS

PCT/ISA/237—Written Opinion of the International Serching Authority—Jun. 7, 2011 (Issued in PCT/SE2010/051060).
Supplementary European Search Report—Jan. 20, 2015 (Issued in Counterpart Application No. 10857957.4).

* cited by examiner

MOUNTING SYSTEM FOR TRANSMITTER RECEIVER MODULES OF AN ACTIVE ELECTRONICALLY SCANNED ARRAY

CROSS-REFERENCE TO RELATED APPLICATIONS

The application is the national phase under 35 U.S.C. §371 of PCT/SE2010/051060 filed 1 Oct. 2010.

TECHNICAL FIELD

The present invention relates to radar and communication systems and more particularly to a mounting system for transmitter receiver modules (TRM:s) in an active electronically scanned antenna (AESA) array. The invention further relates to a TRM for such an inventive mounting system.

BACKGROUND ART

AESA arrays are well known. An AESA is based on a high number of TRM:s that can control the direction of the radar beam by adjusting their individual transmission. Today the TRM:s are normally assembled into a multipack of TRM:s, wherein the multipack is mounted together with other multipacks to form the AESA. The TRM:s are mounted in rows in the individual multipacks. The smallest exchange unit is this multipack which must be exchanged in a whole if one of the TRM:s in the multipack is defective. This is obviously a waste of those TRM:s still working in such an multipack. Further, as several multipacks are mounted adjacent to each other periodical errors can occur, wherein the radar performance of the AESA decreases.

Each multipack is typically provided with metallic structures adapted for support, cooling and shielding of the TRM:s in the multipack. Thereby is the weight of each of the multipacks, and even more the AESA array in a whole, considerable and it is wished to reduce this weight.

SUMMARY OF THE INVENTION

In the view of the above, it is therefore an object of the present invention, that of overcoming the limits of the known technology, both permitting a high packing of TRM:s and obtaining a high maintenance flexibility.

A mounting system for transmitter receiver modules (TRM:s) for receiving a plurality of TRM:s comprises a substrate rear panel provided with TRM contact receiving means on its first side and active support units on its second side.

Said TRM contact means and TRM contact receiving means handles RF-signals, power signals and logic signals. Preferably the TRM contact means and TRM contact receiving means are designed, such that one TRM contact means and one TRM contact receiving means respectively handles the RE-signals, power signals and logic signals.

The TRM:s to be mounted in the mounting system together form a part of an active electronically scanned array (AESA). Each TRM is provided with an upper antenna part and a lower electronic components part, wherein each TRM is provided with TRM contact means located on the lower components part opposite to the upper antenna part.

Said support units supports a plurality of TRM:s and are arranged on the second side of the substrate rear panel such that they can easily be exchanged from the back side of the mounting system. Because the substrate rear panel does not comprise any active components, a failure of the substrate rear panel is very unlikely. The active support units are arranged on, and connected to, the second side of the substrate rear panel, and can thereby easily be exchanged.

The inventive mounting system is characterized in, that the substrate rear panel is constructed, such that a substrate rear panel is adapted to receive said TRM:s in a matrix structure having a plurality of rows and columns, and in that the inventive mounting system is provided with an earth plane. The earth plane shields the AESA from emitting other signals then supposed to and shields the electronic components in the AESA from external electromagnetic interference. The earth plane is parallel to the substrate rear panel and comprises an electric conductive sheet material. The earth plane is arranged, such that when the TRM:s are mounted in the mounting system, the earth plane levels with the TRM:s transition from upper antenna part to lower electronic component part. The lower electronic component part is thereby enclosed by the substrate rear panel and the earth plane.

The inventive mounting system provides a high and effective packing of the TRM:s, due to the matrix structure. The matrix structure also provides a low probability of periodical mechanical faults in the mounting of the TRM:s. Individual TRM:s can still be displaced, but the periodical displacement that can occur when using row like multipacks to create the matrix of TRM:s for an AESA are minimized and the accuracy of the AESA is thereby improved.

Further, due to the location of the support units on the second side of the substrate rear panel these are easy to exchange in case of a defective support unit. Still further, since each TRM is individual contacted to the substrate rear panel, through the TRM contact means, the TRM:s can be individually exchanged in case of a defective TRM. Hence, a replacement of one defective TRM does not automatically involve a replacement of a plurality fully functional TRM:s. Thereby is a high packing and high maintenance flexibility achieved. The inventive mounting system also has the benefit of a flexibility in the radio frequency summation network, i.e. vertical, horizontal or full summation.

The electronics of the TRM:s mounted in the inventive mounting system are effectively shielded from external electromagnetic interference due the earth plane. Further, thereby is also the upper antenna part of the TRM:s shielded from electromagnetic interference radiating from the electronic components located on the lower electronic component part.

Besides of the above, the inventive mounting system also has the advantage of being light weight, due to that the metallic block used for cooling purposes in the prior art is not needed any more. Instead can the electronic components on the lower electronic components part of the TRM be cooled by a fluid flow forced into the channels that are created along the rows of TRM:s and between the substrate rear panel and the earth plane.

Preferably, is the earth plane provided with openings through which the TRM:s can be received. Thereby can the mounting system be preassembled, and the TRM:s be mounted and dismounted from the mounting system without, that the earth plane needs to be removed.

The earth plane is preferably made of a metallic material, such as steel or aluminium, or made of an electric conductive composite or the like.

The substrate rear panel is a passive panel with only passive components, such as distribution networks for radio frequency signals (RE-signals), power signals and logic signals, TRM contact receiving means and radio frequency dividers. Each of said TRM contact receiving means is adapted to receive TRM contact means of one TRM. The substrate rear panel is preferably a printed circuit board. Hence, all the active components are placed either on the TRM:s or on the backside, i.e. as a support unit. Such a substrate rear panel will have a low probability of failure, and a very low need for maintenance.

To secure a correct mounting of the TRM:s, the mounting system is provided with guides. Said guides are arranged in rows, such that one guide separates a TRM from its adjacent TRM in the same row. The guides are adapted to receive the TRM:s such that, the contact means of the TRM:s are received in the contact means of the substrate rear panel. Preferably there is also a guide located at the end of each row, such that also the last TRM in each row has two guides supporting it.

The guides secure a correct positioning of the TRM:s and guides guide the TRM:s, such that during mounting of the TRM:s in the mounting system, the TRM contact means are led into the TRM contact receiving means on the substrate rear panel. Further, the guides support the TRM:s when mounted, whereby there will be less wear on the contact means, since the TRM contact means does not have to absorb the stress caused by vibrations led into the mounting system from the surrounding.

To secure the TRM:s in their desired position said guides are adapted to receive holding means on their upper end. The holding means are adapted to fix said TRM:s in the direction perpendicular to the substrate rear panel (Z-direction), such that when the holding means are fixed into the guides, the TRM:s are fixed in the Z-direction. Alternatively could the holding TRM:s be provided with snap-fittings, wherein the guides are provided with corresponding snap-fittings, locking the TRM:s in the Z-direction.

The mounting system is preferably structured in a symmetrical matrix with the possibility to receive 16 or more TRM:s. Such a matrix could be a 4*4, 5*5 or 6*6 matrix, wherein an 8*8 matrix would be preferred. An 8*8 matrix would have the benefits of high packing rate and still would not become a size, such that the mounting system would become difficult to handle.

The mounting system according to the invention preferably comprises cooling means. The cooling means is adapted such that TRM:s mounted in the mounting system is cooled by a fluid flow generated by the cooling means, wherein the fluid flow preferably is an airflow. The mounting system is adapted, such that the fluid flow flows through the mounting system between the substrate rear plane and the earth plane, whereby the electronic component part of the TRM:s are exposed thereby. By providing cooling means able to produce a cooling fluid flow, i.e. air flow between the substrate rear plane and the earth plane, costs and weight are saved relative to known systems in which the cooling is provided through a metallic structure. The cooling means can be any known cooling means suitable therefore.

Depending on temperature requirements for specific components on the TRM:s cooling flanges could be provided on the TRM to improve the cooling effect for the TRM:s. The cooling flanges can be provided directly on one or several electronic components and/or on a EMC-shielding covering the components and/or on the back side of the TRM:s. Preferably is the cooling means arranged such, that the fluid flow is provided to flow along the rows of TRM:s in the mounting system.

The substrate rear panel of the invention is mounted on a structural support board, such as a sandwich board, providing structural support to the substrate rear panel. The TRM:s are contacted to the substrate rear panel on its front side, whereby the structural support board is attached to the backside of the substrate rear panel. The support units are contacted with the substrate rear panel through said structural support board.

The matrix layout of the inventive mounting system can be a rectangular matrix layout or a triangular such that every second of said rows are displaced relative the adjacent rows. With a displacement of every second row, i.e. a triangular matrix layout, the same effect as an AESA having a strict rectangular matrix layout can be achieved using fewer TRM:s.

The invention also comprises a transmitter receiver module (TRM) for mounting in the inventive mounting system according to the above. The inventive TRM comprises an upper antenna part and a lower electronic component part, wherein the upper antenna part is an antenna and the lower component part is provided with electronic components, i.e. logic components, power components, transmitter and receiver components. The inventive TRM is equipped with TRM contact means handling radio frequency signals (RF-signals), power signals and logical signals. The TRM contact means preferably handling all the three mentioned signal types in one contact, wherein just one single contact interface to the substrate rear panel of the mounting system have to be provided for each TRM.

The inventive TRM is characterised in, that the TRM is provided with an EMC-collar between the upper antenna part and the lower component part. Said collar is adapted to have a continuously contact with an earth plane of the mounting system, such that no EMC-radiation can leak out through the mounting openings in the earth plane.

Said collar is preferably an electric conductive sheet provided with an EMC-shielding seal, said seal is adapted to seal towards said earth plane such that the antenna part of the TRM and the component part of the TRM are EMC-shielded from each other. The shielding seal is located on around the circumference of the side of the collar that will be in contact with the earth plane, when the TRM is mounted in the mounting system.

DETAILED DESCRIPTION

Figure 1:
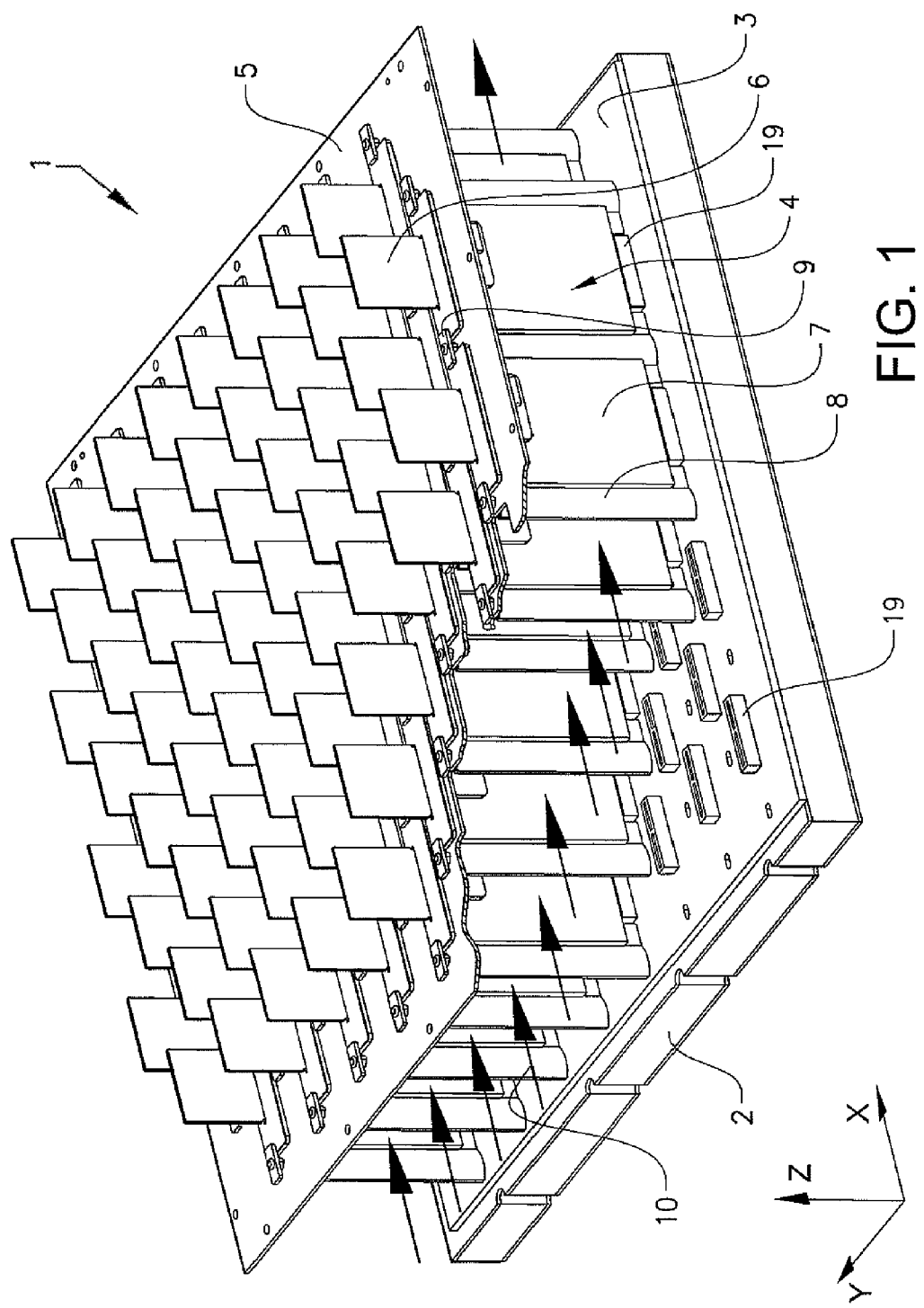
FIG. 1 discloses a schematic cut-out view of an inventive mounting system.

FIG. 1 illustrates an inventive mounting system in which the TRM:s are mounted in a 8*8 matrix. In the figure is every second row displaced relative its adjacent rows. The mounting system 1 is resting on a sandwich board 2, on which the substrate rear panel 3 is mounted. The substrate rear panel 3 is adapted with TRM contact means, for receiving the TRM:s 4. On the back side of the sandwich board 2 are support units (not shown) mounted. The support units 11 are connected to the substrate rear panel 3 through the sandwich board 2. The support units 11 mounted on the back side of the sandwich board 2 can be exchanged, without having to demount other parts of the mounting system. The substrate rear panel 3 is a passive component of the AESA, i.e. it does not involve any active components and has therefore a low risk of failure. This is an advantage, since, the substrate rear panel 3 is so integrated in the mounting system, that it would be complex and expensive to exchange it.

Further, in FIG. 1 the position of the earth plane 5 between the upper antenna part 6 and the lower electric component part 7 of the TRM:s 4 can be seen. The TRM:s 4 are guided into their positions by guides 8, which are arranged in the rows such, that one guide 8 is positioned between a TRM 4 and its adjacent TRM 4 in that row. The TRM:s 4 are fixed in the Z-direction through holding means 9, which are fastened in the guides 8. The fixation of the TRM:s 4 are further explained in conjunction with FIG. 2.

The inventive mounting system 1 is adapted such, that a cooling system (not shown) easily can cool the lower electronic part 7 of the TRM:s 4. A fluid flow 10 is forced between the rows of TRM:s 4 between the substrate rear panel 3 and the earth plane 5, wherein the electronics of the TRM:s 4 are cooled thereby, the fluid flow 10 is preferably an airflow.

Figure 2:
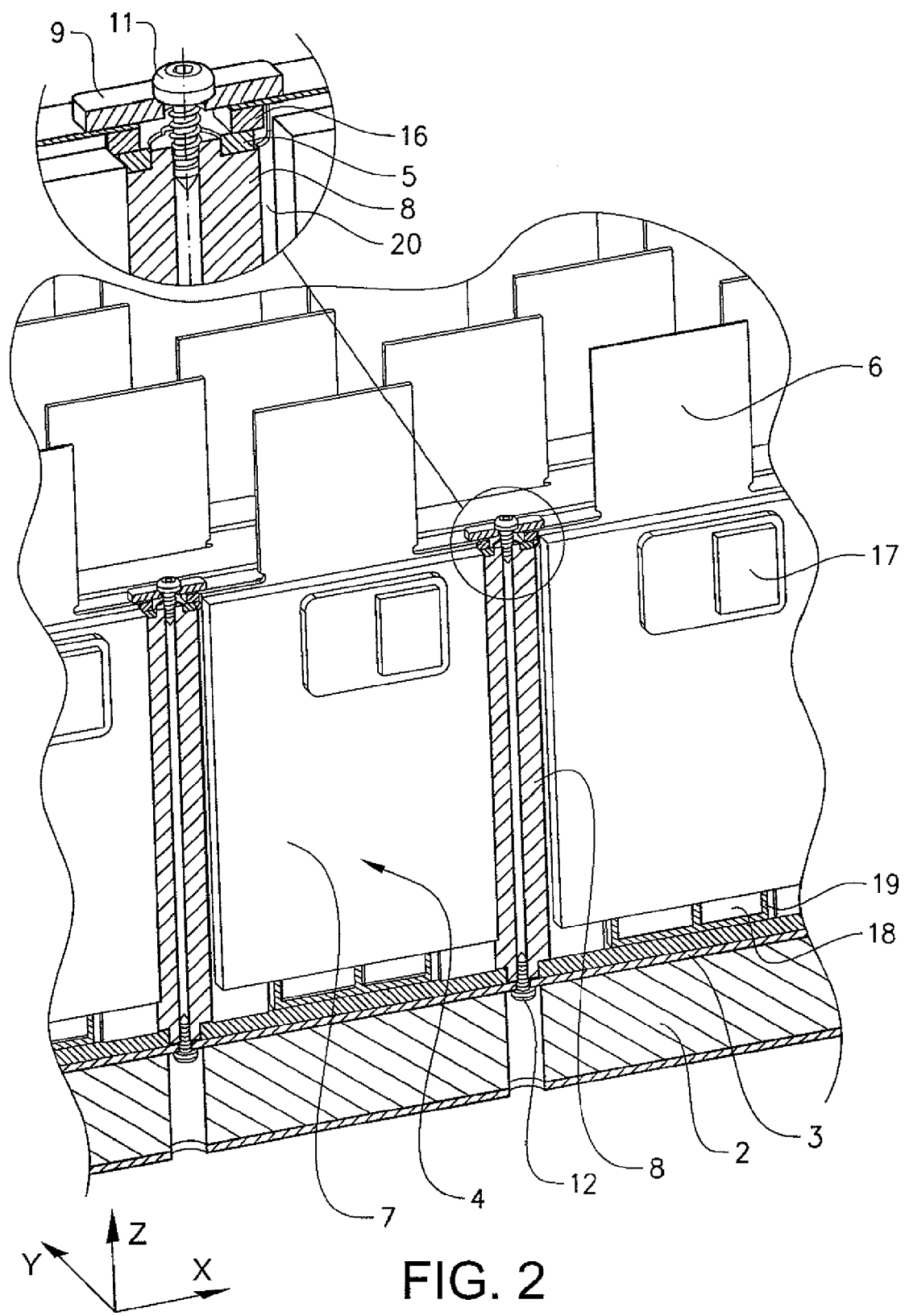
FIG. 2 schematically discloses the function of a guide.
Figure 4:
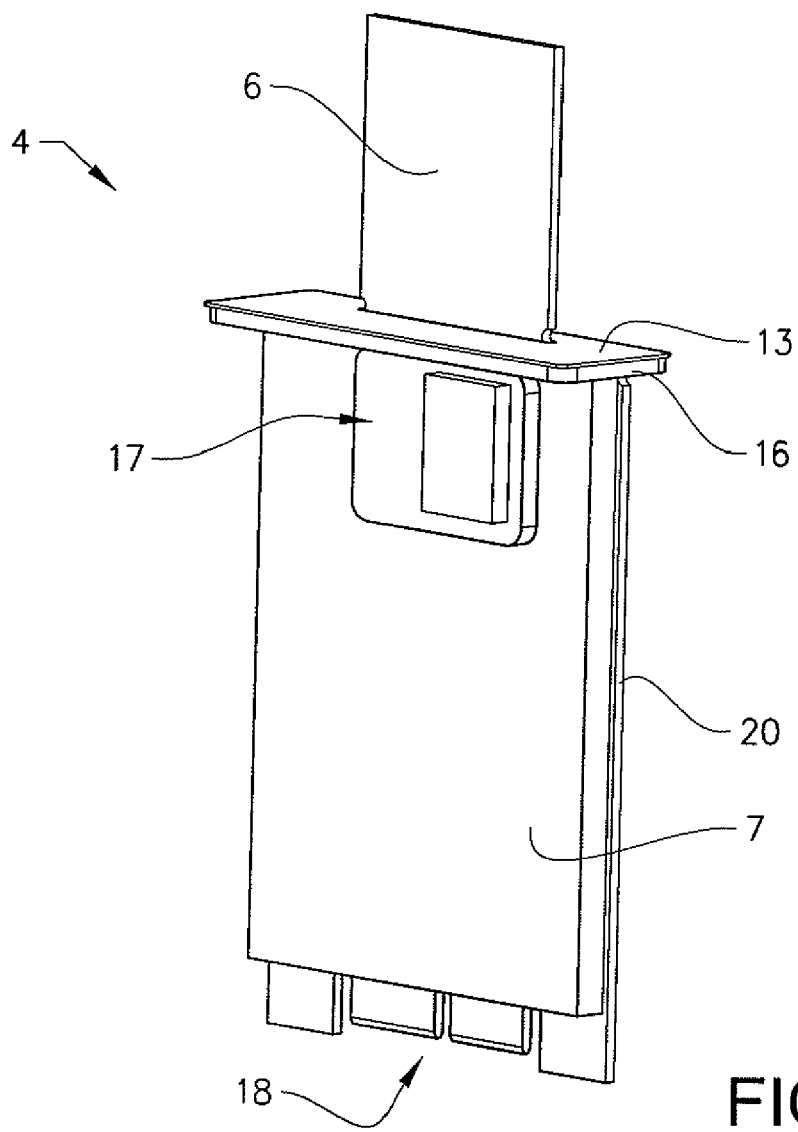
FIG. 4 discloses a schematic drawing of an inventive TRM.

In FIG. 2, it is a schematic example of how the TRM:s 4 are supported by the guides 8 shown. The TRM:s 4 are supported on each side by guides 8, which guides 8 are fixed into the substrate rear panel 3 and into the sandwich board 2 through the fixing means 12. When the guides 8 are mounted on the substrate rear panel 3 the TRM:s 4 are guided into their respective position and into the TRM contact receiving means 19. Further, when the TRM:s 4 are in position, holding means 9 keeps the TRM:s 4 in their vertical position. The holding means 9 are fixed in the guides 8 with a fixation means 11, such as a screw or the like. The TRM:s 4 are also provided with a EMC-shielding collar 13, which seals against the earth plane 5. The EMC-shielding collar 13 is also shown in FIG. 4. The holding means 9 and the fixing means 11 and 12 as screws illustrated in FIG. 2 is just to exemplify the fixation of the TRM:s 4, other type of holding means and fixing means is just as relevant in the construction, these could be snap fittings or form fitting. The type of holding means is not part of the invention; it is rather a task for the person skilled in the art to choose among the relevant options known to him.

Figure 3:
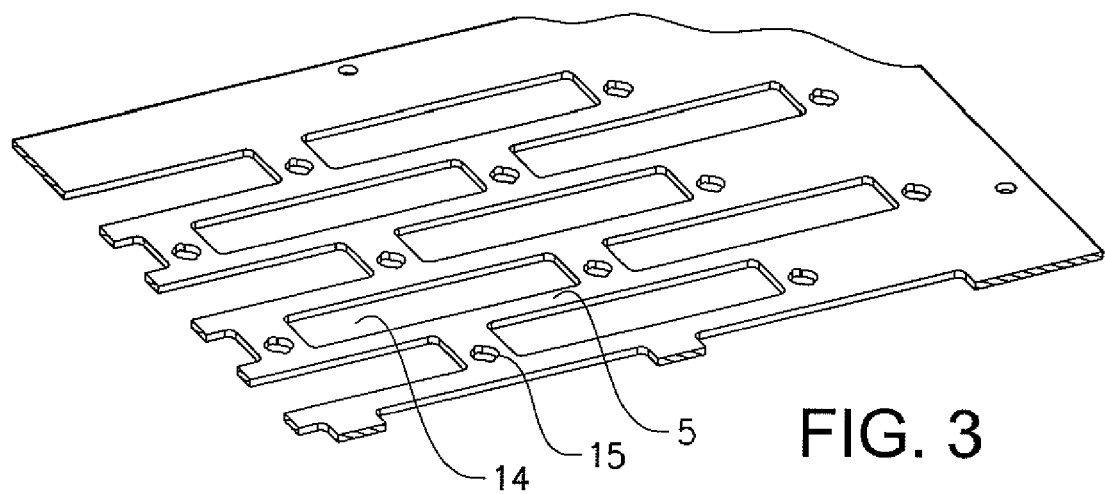
FIG. 3 discloses a schematic drawing of an earth plane.

FIG. 3 shows the earth plane 5 in a triangular configuration and the openings 14 through which the TRM:s 4 are mounted. Further, the earth plane 5 is provided with openings 15 through which the fixation means 11 reaches down to the guides 8. The earth plane 5 is made of an electric conductive material such as a sheet of aluminum, steel or an electric conductive composite, thereby is the earth plane 5 a EMC-shielding between the upper antenna part 6 and the lower electric component part 7 of the TRM:s 4.

In FIG. 4 is an embodiment of an inventive TRM 4 shown. The TRM 4 has an upper antenna part 6 and a lower electronic component part 7. In between the upper antenna part 6 and the lower electronic component part 7 is the collar 13 arranged. The EMC-shielding collar 13 is provided with an EMC-seal 16 to seal between the EMC-shielding collar 13 and the earth plane. Thereby becomes the upper antenna part 6 and the lower electronic component part 7 fully EMC-shielded from each other. Further, the whole electronic component part 7 is in this embodiment covered by an EMC-shielding cover, which is bulged 17, such that electronic components with greater dimensions can be fitted under the bulged part 17. Alternatively, each electronic component of the TRM 4 can be covered by its own EMC-shielding case.

At the bottom side of the lower electronic component part 7 is the TRM contact means arranged 18, which are to be fitted into the TRM contact receiving means 19 arranged on the substrate rear panel 3.

When the TRM is mounted in the inventive mounting system 1 it is the side edges 20 of the lower components part 7 that are guided by the guides 8.

The invention claimed is:

1. A mounting system for transmitter receiver modules, adapted to receive a plurality of transmitter receiver modules, wherein the transmitter receiver modules together form a part of an active electronically scanned array, and each transmitter receiver module is provided with an upper antenna part and a lower electronic components part, where the lower electronic components part is provided with a transmitter receiver contact on an end opposite the upper antenna part, and wherein the mounting system comprises a substrate rear panel provided with a transmitter receiver contact receiver on a first side, and active support units are arranged on a second side, wherein each of said transmitter receiver contact receivers are adapted to receive a transmitter receiver contact of one of the transmitter receiver modules, and wherein said support units are adapted to support a plurality of transmitter receiver modules, wherein said substrate rear panel is constructed such that one single substrate rear panel is adapted to receive said transmitter receiver modules in a matrix structure having a plurality of rows and columns and said mounting system is provided with an earth plane, said earth plane is parallel to the substrate rear panel and comprises an electric conductive sheet, and is arranged such that, when the transmitter receiver modules are mounted in the mounting system, the earth plane levels with the transmitter receiver modules transition from upper antenna part to lower electronic components part, and the lower electronic components parts thereby is enclosed by the substrate rear panel and the earth plane.

2. The mounting system according to claim 1, wherein the earth plane is provided with openings, through which the transmitter receiver modules can be mounted, and which correspond to the matrix structure of the substrate rear panel.

3. The mounting system according to claim 1, wherein the substrate rear panel is printed circuit board with only passive components.

4. The mounting system according to claim 1, wherein guides are arranged in said rows, such that one guide separates a transmitter receiver module from its adjacent transmitter receiver modules in the same row, said guides are adapted and arranged to receive the transmitter receiver modules such that, the transmitter receiver module contacts are received in the transmitter receiver module contact receivers on the substrate rear panel.

5. The mounting system according to claim 4, wherein said guides are adapted to receive holders on an upper end, said holders are adapted to fix said transmitter receiver modules such that the transmitter receiver modules are fixed in the guides.

6. The mounting system according to claim 1, wherein said substrate rear panel is provided with transmitter receiver module contact receivers for 16 transmitter receiver modules, in a 4*4 matrix.

7. The mounting system according to claim 1, wherein said mounting system is adapted to provide a cooling means, such that transmitter receiver modules mounted in the mounting system are cooled by a fluid flow adapted to flow through the mounting system between the substrate rear plane and the earth plane such that the electronics of the transmitter receiver modules mounted in the mounting system are cooled thereby.

8. The mounting system according to claim 7, wherein said fluid flow is provided to flow along the rows of transmitter receiver modules in the mounting system.

9. The mounting system according to claim 1, wherein said substrate rear panel is mounted on a structural support board providing structural support to the substrate rear panel.

10. The mounting system according to claim 9, wherein said support units are mounted on the structural support board opposite the substrate rear panel and contacted with the substrate rear panel through said structural support board.

11. The mounting system according to claim 1, wherein every second of said rows are displaced relative the adjacent rows, such that a triangular matrix is created.

12. The mounting system according to claim 3, wherein the passive components comprise distribution networks for RF-signals, power-signals and logic-signals, transmitter receiver contact receivers or radio frequency dividers.

13. The mounting system according to claim 1, wherein said substrate rear panel is provided with transmitter receiver module contact receivers for 64 transmitter receiver modules, in a 8*8 matrix.

14. The mounting system according to claim 9, wherein the structural support board comprises a sandwich board.

* * * * *

UNITED STATES PATENT AND TRADEMARK OFFICE
CERTIFICATE OF CORRECTION

PATENT NO. : 9,192,047 B2  
APPLICATION NO. : 13/824781  
DATED : November 17, 2015  
INVENTOR(S) : Martin Tevell et al.

It is certified that error appears in the above-identified patent and that said Letters Patent is hereby corrected as shown below:

Specification

At column 1, line 50 should read
    Said TRM contact means and TRM contact receiving means handles RF-signals, power signals and logic signals. Preferably the TRM contact means and TRM contact receiving means are designed, such that one TRM contact means and one TRM contact receiving means respectively handles the RF-signals, power signals and logic signals.

At column 3, line 13 should read
    The guides secure a correct positioning of the TRM:s and guide the TRM:s, such that during mounting of the TRM:s in the mounting system, the TRM contact means are led into the TRM contact receiving means on the substrate rear panel. Further, the guides support the TRM:s when mounted, whereby there will be less wear on the contact means, since the TRM contact means does not have to absorb the stress caused by vibrations led into the mounting system from the surrounding.

Signed and Sealed this  
Fifteenth Day of March, 2016

Michelle K. Lee  
*Director of the United States Patent and Trademark Office*